United States Patent
Pasqualetto

(10) Patent No.: US 10,320,367 B2
(45) Date of Patent: Jun. 11, 2019

(54) METHOD FOR SYNCHRONIZING COMMUTATED CONTROL CIRCUITS CONTROLLED BY PWM CONTROL SIGNALS

(71) Applicants: CONTINENTAL AUTOMOTIVE FRANCE, Toulouse (FR); CONTINENTAL AUTOMOTIVE GMBH, Hannover (DE)

(72) Inventor: Angelo Pasqualetto, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/568,711

(22) PCT Filed: Apr. 21, 2016

(86) PCT No.: PCT/EP2016/000645
§ 371 (c)(1),
(2) Date: Oct. 23, 2017

(87) PCT Pub. No.: WO2016/169652
PCT Pub. Date: Oct. 27, 2016

(65) Prior Publication Data
US 2018/0167059 A1    Jun. 14, 2018

(30) Foreign Application Priority Data
Apr. 24, 2015 (FR) ...................... 15 53699

(51) Int. Cl.
*H02M 1/00* (2006.01)
*H02M 1/44* (2007.01)
(Continued)

(52) U.S. Cl.
CPC .......... *H03K 3/02332* (2013.01); *H02M 1/44* (2013.01); *H02M 7/537* (2013.01);
(Continued)

(58) Field of Classification Search
CPC .......................... H03K 3/023; H03K 3/0233; H03K 3/02332; H03K 5/15; H03K 5/15006;
(Continued)

(56) References Cited

U.S. PATENT DOCUMENTS

| 5,130,561 A | 7/1992 | Elliott et al. |
| 6,404,657 B1 | 6/2002 | Mangtani et al. |

(Continued)

FOREIGN PATENT DOCUMENTS

| EP | 2445110 A1 | 4/2012 |
| EP | 2722987 A1 | 4/2014 |
| EP | 2752983 A1 | 7/2014 |

OTHER PUBLICATIONS

International Search Report, dated Jul. 18, 2016, from corresponding PCT application No. PCT/EP2016/000645.

*Primary Examiner* — Lincoln D Donovan
*Assistant Examiner* — Diana J. Cheng
(74) *Attorney, Agent, or Firm* — Young & Thompson

(57) ABSTRACT

Disclosed is a method for synchronising at least one slave control circuit, controlled by a slave control signal having pulse width modulation, with a master control circuit, controlled by a master control signal having pulse width modulation, including the following steps: the master control circuit emitting a synchronisation signal indicating a master edge of an electrical quantity; the slave control circuit receiving the synchronisation signal; measuring a delay between a slave edge of the same electrical quantity and the master edge of the electrical quantity; time-shifting the slave (Continued)

control signal so as to reduce the delay; and repeating the measurement step until the delay is eliminated.

19 Claims, 4 Drawing Sheets

(51) Int. Cl.
    *H03K 5/15*     (2006.01)
    *H02M 7/537*     (2006.01)
    *H03K 17/16*     (2006.01)
    *H02M 7/5387*     (2007.01)
    *H03K 3/0233*     (2006.01)

(52) U.S. Cl.
    CPC ............. *H03K 5/15* (2013.01); *H03K 17/165* (2013.01); *H02M 7/5387* (2013.01); *H02M 2001/008* (2013.01)

(58) Field of Classification Search
CPC ............. H03K 5/15013; H03K 5/1502; H03K 5/15026; H03K 5/15033; H03K 5/1504; H03K 5/15046; H03K 5/15053; H03K 5/1506; H03K 5/15066; H03K 5/15073; H03K 5/1508; H03K 5/15086; H03K 5/15093; H03K 17/16; H03K 17/161; H03K 17/165; H03K 17/166; H03K 17/167
USPC ......................................... 327/199, 202–204
See application file for complete search history.

(56) References Cited

U.S. PATENT DOCUMENTS

2005/0225178 A1   10/2005   Shao et al.
2007/0263617 A1   11/2007   Takemura
2009/0195071 A1   8/2009   Furuse et al.

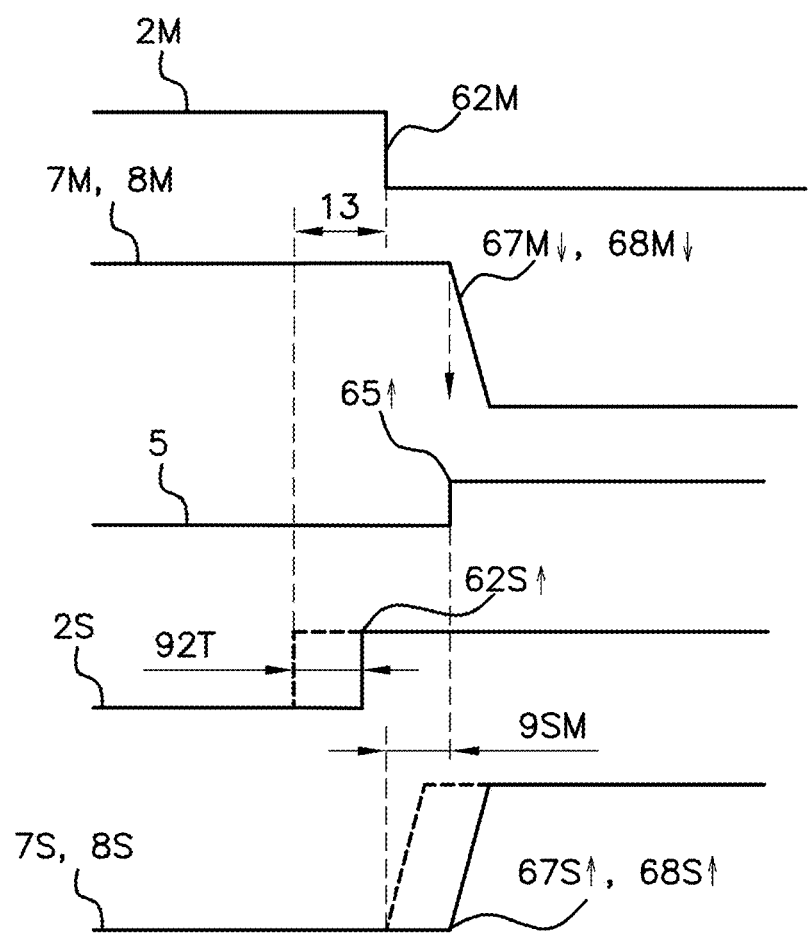

METHOD FOR SYNCHRONIZING COMMUTATED CONTROL CIRCUITS CONTROLLED BY PWM CONTROL SIGNALS

The present invention relates to the technical field of electromagnetic compatibility in the context of controlling electrical loads, more particularly in the case of multiple loads being controlled by switched control circuits that are controlled by pulse-width-modulation (PWM) control signals.

BACKGROUND OF THE INVENTION

A PWM control signal is a discrete signal exhibiting edges upon each change of state. A control circuit switches upon each edge of the control signal. Each switching operation causes a sudden current variation or edge and a sudden voltage variation or edge. A sudden current variation or edge causes interference in the form of a conducted emission. A sudden voltage variation or edge causes interference in the form of a radiated emission. The higher the slew rate, or slope, of the current or voltage, the more substantial, and hence harmful, the interference.

It is known practice, in order to decrease conducted interference, to decrease the slew rate of the current and, in order to decrease radiated interference, to decrease the slew rate of the voltage.

The slew rate of the current may be decreased by increasing the capacitance at the input of the voltage source, typically by replacing the input capacitor. An increase in this capacitance leads to a detrimental increase in cost.

Radiated interference following variations in voltage may be decreased by acting upon the cable bundle: by twisting the wires of the cable bundle or by implementing shielding. Carrying out such twisting leads to a detrimental increase in cost. Moreover, such an operation is rarely the preserve of the control circuit manufacturer, which does not necessarily specialize in cable bundles.

The lower the slew rate, the lesser the interference. However, the lower the slew rate, the higher the dissipated power. An increase in dissipated power leads to an increase in the size of components and thus to a detrimental increase in cost.

In addition, when multiple control circuits operate together, at least two such control circuits may advantageously be synchronized, so that at least some current or voltage edges or sudden variations therein are made to coincide in order to compensate for, or even cancel out, the interference resulting from these edges. Such synchronization is particularly advantageous when the respective control signals of the control circuits have one and the same period.

Trivially, it appears to be possible to synchronize at least two control circuits, by directly synchronizing the edges of the control signals. However, such an approach does not meet its objective in that, due to variations in the electrical characteristics of the components, thermal drift, variations in the applied voltage, or else variations in the current level, the interval between one edge of the control signal and one current or voltage edge exhibits dispersion that is sufficiently substantial, from one control circuit to another, for the interference not to be synchronized enough to allow compensation.

SUMMARY OF INVENTION

Therefore, according to one important feature of the invention, means allowing the causes of the interference, namely the current edges or, alternatively, the voltage edges, to be synchronized are put in place.

The subject of the invention is a method for synchronizing at least one slave control circuit, of switched type, controlled by a slave control signal having pulse width modulation exhibiting a slave period and controlling a slave load, with a master control circuit, of switched type, controlled by a master control signal having pulse width modulation exhibiting a master period and controlling a master load, comprising the following steps:
  the master control circuit transmitting a synchronization signal that is indicative of a master edge of an electrical quantity of the master circuit;
  the slave control circuit receiving the synchronization signal;
  measuring an interval between a slave edge of the same electrical quantity of the slave circuit and the master edge of the electrical quantity of the master circuit, such as indicated by the synchronization signal;
  time-shifting the slave control signal so as to decrease said interval;
  repeating the measurement step until said interval is canceled out.

According to another feature, the method comprises an additional step, prior to the measurement step, of initially delaying the master control signal so as to create a synchronization margin.

According to another feature, the slave period is equal to the master period.

According to another feature, the electrical quantity is the current flowing through the control circuit.

According to another feature, the electrical quantity is the voltage across the terminals of the load.

According to another feature, the master edge and the one or more slave edges of the measurement step are chosen from among periodic edges.

According to another feature, the method additionally comprises the steps of:
  configuring the master control signal according to a first logic, with a choice of a high level at the start of a period or a high level at the end of a period; and
  configuring the one or more slave control signals according to a second logic, different from the first logic.

According to another feature, the direction of the master edge and the direction of the one or more slave edges of the measurement step are opposite.

According to another feature, the master load is at least inductive.

According to another feature, the one or more slave loads are at least inductive.

The invention also relates to an electronic component capable of implementing at least one master control circuit and/or at least one slave control circuit, which are capable of being synchronized by such a method.

According to another feature, the component comprises at least one master control circuit and at least one slave control circuit, positioned within one and the same housing.

BRIEF DESCRIPTION OF THE DRAWINGS

Other features, details and advantages of the invention will become more clearly apparent from the detailed description provided below by way of indication with reference to the drawings, in which:

FIGS. 6 and 7 show a diagram illustrating the various electrical signals for a master control circuit and for a slave control circuit, in two successive steps of the synchronization method.

DETAILED DESCRIPTION OF THE EMBODIMENTS

Figure 1:
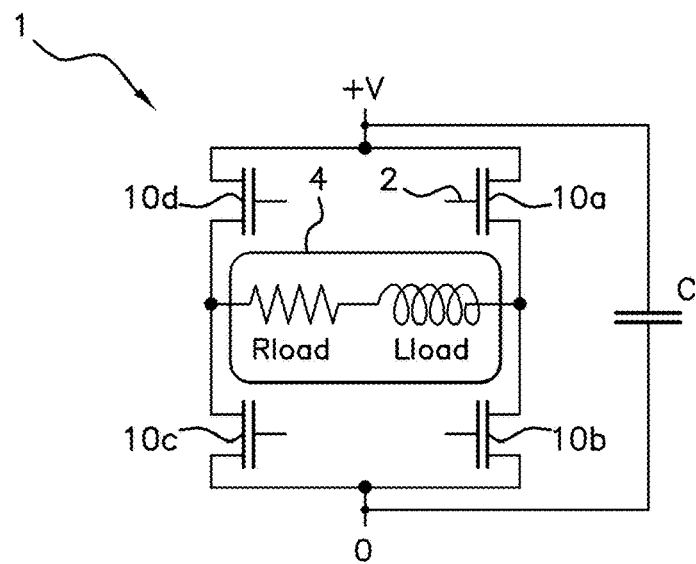
FIG. 1 illustrates one example of a switched control circuit, here an H-bridge.

Before starting, it is helpful to specify the notation used for the reference symbols. A reference symbol comprises a number, optionally followed by a figure, optionally followed by one to three letters. A single number generically denotes an element. An optional additional figure specifies to which other element the element denoted by the number is related.

Thus, for example, 2 denotes a control signal and 6 denotes an edge. 62 refers to a control signal edge.

An element may be further specified by one or two letters. The letter "M" characterizes an element relating to the master, while the letter "S" characterizes an element relating to the slave. The letter "a" characterizes a non-synchronized element, while the letter "b" characterizes a synchronized element. The letter "p" characterizes a periodic element, while the letter "q" characterizes an aperiodic element.

In the particular case of an edge, or of an interval associated with such an edge, an arrow, pointing either up or down, characterizes the edge as either a rising or falling edge.

Thus, for example, 2M is a master control signal and 2S is a slave control signal.

It is of course possible to combine this notation. Thus, for example, 62M↑ denotes a master (M) control signal (2) rising (↑) edge (6). An occurrence of interference 12aMq denotes an occurrence of interference (12) in a non-synchronized case (a) for the aperiodic (q) master (M) control circuit.

The invention relates to a method for synchronizing at least two control circuits 1, each control circuit 1 being of switched type, controlled by a pulse-width-modulation control signal 2.

A switched control circuit 1 makes it possible, in a known manner, to control a load 4 by means of at least one switch 10. Such a switch 10 is capable of selectively opening or closing a circuit comprising at least one load 4 and a voltage source. Such a switch 10 is typically implemented by a transistor 10, advantageously a MOSFET, bipolar or IGBT transistor.

The switched control circuit family 1 comprises multiple members. Certain configurations that are members of this family will be presented in order to specify the content of this family, which should not however be reduced to these few examples. This family is characterized in that a member configuration comprises at least one switch 10 controlled by a pulse-width-modulation control signal 2.

A switch 10, positioned between one terminal of the load 4 and ground, 0V, the other terminal of the load being linked to the positive potential, +V, forms a control circuit 1 on the low potential side or ground side (low side driver).

A switch 10, positioned between one terminal of the load 4 and the positive potential, +V, the other terminal of the load being linked to ground, 0V, forms a control circuit 1 on the high potential side or supply side (high side driver).

Another example of a switched control circuit 1 may be a half-bridge, comprising two switches 10.

As illustrated in FIG. 1, another example of a switched control circuit 1 may be an H-bridge. An H-bridge typically comprises four switches 10a-d, positioned in the shape of an "H" on the four vertical branches of an "H", one load 4 being placed on the horizontal bar of the "H". In a known manner, an H-bridge is typically used to control a load 4 by using a diagonal pair of switches 10. Thus, while the switches 10d, 10b of a first diagonal pair are forced open, the switches 10a, 10c of the second diagonal pair are used to control the load 4. One of the switches, for example 10c, is forced closed, while the other switch 10a is controlled by means of a pulse width modulation (PWM) control signal 2. Such a PWM signal is a periodic all-or-nothing, or discrete, signal of period 3, characterized by a duty cycle defined by the duration for which the signal 2 is in the high state 11 to the period 3. It is assumed by convention that a high state 11 of the control signal 2 forces the switch 10 to close. For a primarily inductive load 4, the mean current flowing through the load 4 is substantially proportional to the duty cycle. By varying the duty cycle over time it is thus possible to control the mean current in the load 4.

The current in the load 4 varies slowly. However, the current 7 flowing through the control circuit exhibits a sudden variation after each switching operation. This sudden variation is the cause of interference.

One advantage of an H-bridge is that it makes it possible, by using the other diagonal pair of switches 10d, 10b, to control the load 4 similarly to that described above, but with a current flowing through the load 4 in the opposite direction. This is advantageous for driving a motor, and thus changing the running direction thereof.

Another example of a switched control circuit 1 is a control circuit 1 that can be used for the incremental control of a motor. Such a control circuit 1 is also known as a stepper.

Regardless of the control circuit 1 employed, due to the presence of at least one switch 10, controlling it using a control signal 2 causes switching operations that are the root of the problem.

Figure 2:
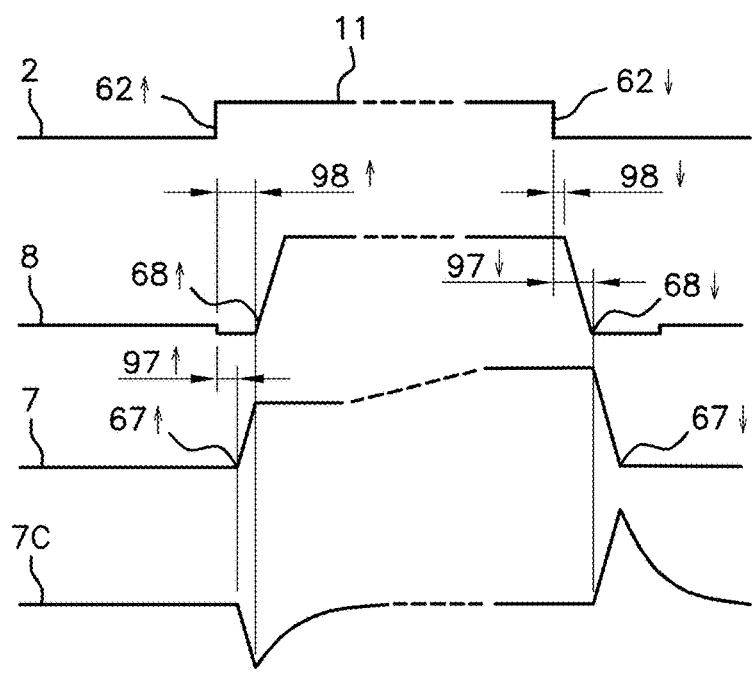
FIG. 2 shows a diagram illustrating the relationships between the control signal, the current flowing through the control circuit, the voltage across the terminals of the load and the current flowing through the input capacitor.

With reference to FIG. 2, it will now be described what happens during switching. The diagram of FIG. 2 shows, with time as abscissa, a control signal 2, correlated with a current signal 7 flowing through the control circuit, and with a voltage signal 8 across the terminals of the load 4. The control signal 2 is initially in the low state. Therefore, the switch 10 is initially open, opening the circuit containing the load 4. It follows that the current 7 flowing through the control circuit, the voltage 8 and the current 7C flowing through the input capacitor C are zero.

The control signal 2 changes state to the rising edge 62↑, and transitions to the high state 11. This change of state controls the switch 10, which is forced closed and thus closes the circuit, applying the voltage source +V to the load 4. A current 7 is subsequently established, but with a delay 97↑ between the edge 62↑ of the control signal 2 and the beginning of the current 7 edge 67↑.

This causes an increase in the voltage 8, but with a delay 98↑ between the edge 62↑ of the control signal 2 and the beginning of the voltage 8 edge 68↑.

Figure 4:
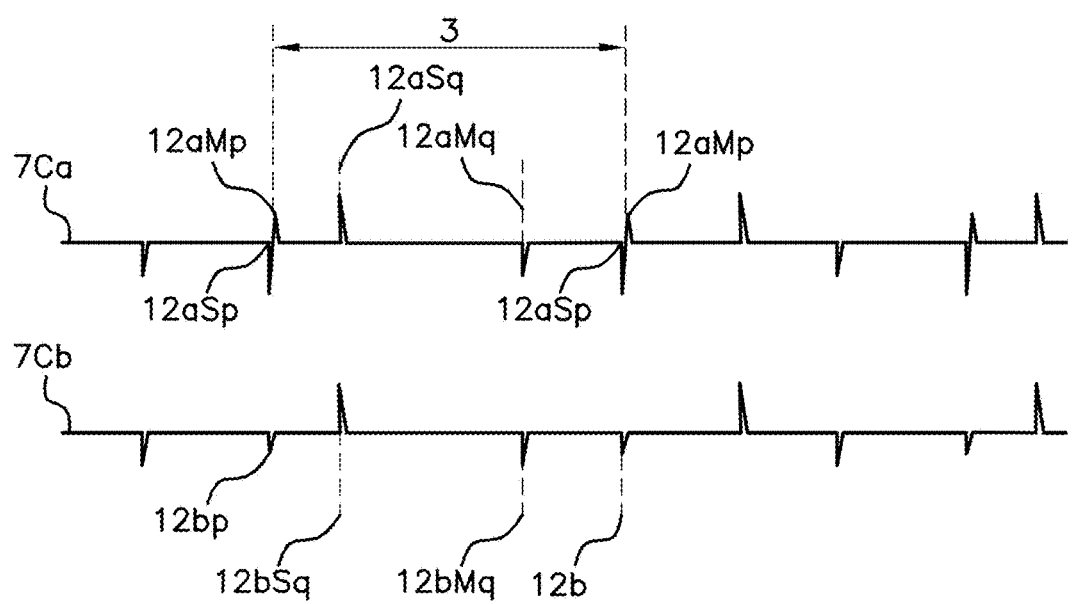
FIG. 4 illustrates two curves of current flowing through the input capacitor, with and without synchronization.

Each switching operation generates a current 7 edge 67 and a voltage 8 edge 68, of the same direction as the edge of the control signal 2. Thus, a rising edge 62↑ generates a rising edge 67↑ with a delay 97↑, and a rising edge 68↑ with a delay 98↑. A falling edge 62↓ generates a falling edge 67↓ with a delay 97↓, and a falling edge 68↓ with a delay 98↓. Each current 7 edge 67, whether rising 67↑ or falling 67↓, causes conducted interference 12, such as illustrated in FIG. 4. Each voltage 8 edge 68, whether rising 68↑ or falling 68↓, causes radiated interference 12.

In order to decrease the harmful effects of these occurrences of interference 12, it is ensured that at least some of the occurrences of interference 12 of a first control circuit 1 occur at the same time as occurrences of interference 12 of a second control circuit 1, so that they compensate for one another. In order to achieve this, certain edges of an electrical quantity 7, 8 of at least one control circuit 1, which will be referred to as the one or more slave control circuits 1S, are synchronized with corresponding edges of the same electrical quantity 7, 8 of a control circuit 1, which will be referred to as the master control circuit 1M.

Depending on the type of interference 12, namely either conducted interference or radiated interference, that it is desired to attenuate, the electrical quantity 7, 8, of which the edges 67, 68 are synchronized, is chosen from between a current 7 or a voltage 8.

Figure 3:
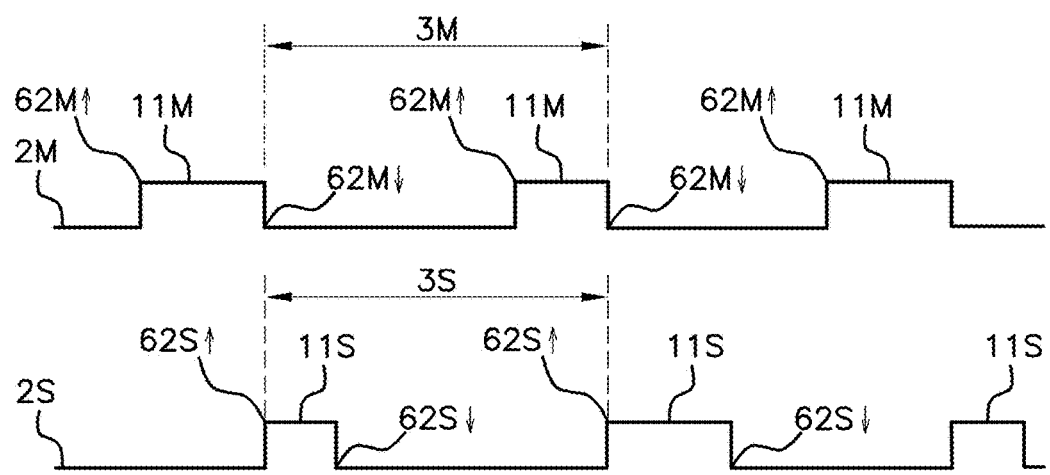
FIG. 3 illustrates two control signals, configured so as to be capable of being efficiently synchronized.

With reference to FIG. 3, showing a diagram with time as abscissa, a master control signal 2M applied to the master control circuit 1M and a slave control signal 2S applied to the slave control circuit 1S are shown.

These two control signals 2M, 2S are periodic PWM signals with respective periods 3M, 3S. Thus, in the master period 3M, the master control signal 2M comprises a master rising edge 62M↑ and a master falling edge 62M↓. Similarly, in the slave period 3S, the slave control signal 2S comprises a slave rising edge 62S↑ and a slave falling edge 62S↓. One of the two edges 62 of a control signal 2 is periodic, while the other edge 62 is positioned at a variable time, allowing the duty cycle to be varied. Thus, in FIG. 3, the master falling edge 62M↓ is periodic, while the master rising edge 62M↑ is variable. Like for the slave control signal 2S, the slave rising edge 62S↑ is periodic, while the slave falling edge 62S↓ is variable.

The description is presented with a periodic edge of the master signal 2M that is falling, but it could just as well be presented with a periodic edge of the master signal 2M that is rising.

As illustrated in FIG. 4, showing a diagram with time as abscissa, a current 7Ca, 7Cb flowing through an input capacitor C positioned at the terminals (0V, +V) of the supply voltage source (cf. FIG. 1) allows conducted interference 12 to occur for each edge 67 of the current 7, i.e. to within a delay 97, for each edge 62 of the control signal 2.

Figure 5:
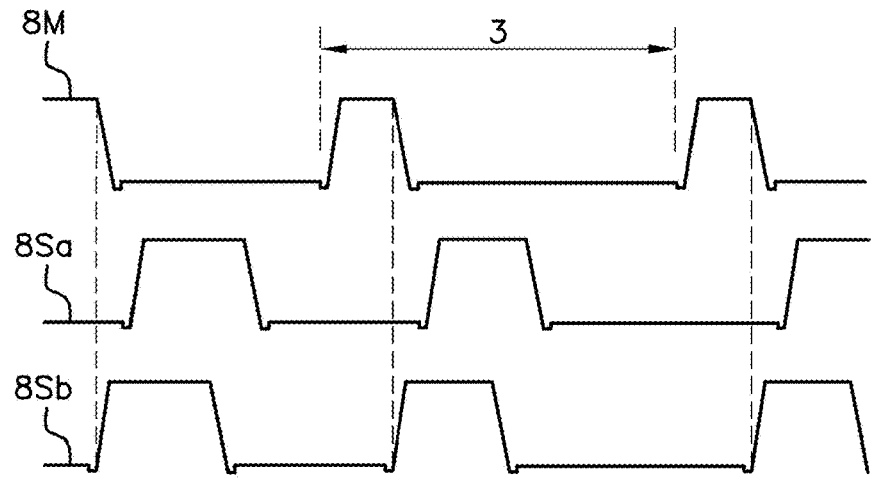
FIG. 5 illustrates two voltage curves, with and without synchronization.

As illustrated in FIG. 5, showing a diagram with time as abscissa, a voltage 8M, 8Sa, 8Sb allows radiated interference 12 to occur for each voltage 8 edge 68, i.e. to within a delay 98, for each edge 62.

It follows that, for two control circuits 1M, 1S, controlled by two control signals 2M, 2S over a period 3M, 3S, respectively, four edges 62M↑, 62M↓, 62S↑, 62S↓, such as shown in FIG. 3, generate four edges 67M↑, 67M↓, 67S↑, 67S↓ of the current 7, causing four occurrences of interference 12aMp, 12aMq, 12aSp, 12aSq. Therefore, with a delay 97 between an edge 62 of the control signal 2 and an edge 67 of the current 7, the master falling edge 62M↓, causes an occurrence of interference 12aMp, the master rising edge 62M↑ causes an occurrence of interference 12aMq, the slave rising edge 62S↑ causes an occurrence of interference 12aSp, the slave falling edge 62S↓, causes an occurrence of interference 12aSq, such as can be seen on a current signal 7Ca, in the absence of synchronization.

Analogously, these same four edges 62M↑, 62M↓, 62S↑, 62S↓, such as shown in FIG. 3, generate four voltage 8 edges 68M↑, 68M↓, 68S↑, 68S↓, causing four occurrences of interference, with a delay 98 between one edge 62 of the control signal 2 and one edge 68 of the voltage 8.

Assuming that for one and the same control circuit 1 the delay 97 in the current 7 remains substantially constant, a periodic edge, here the master falling edge 62M↓, or the slave rising edge 62S↑, generates an occurrence of interference 12aMp or an occurrence of interference 12aSp, which is itself also periodic.

Moreover, if an edge 6 in one direction, either rising or falling, generates an occurrence of interference 12 of a first sign, either positive or negative, a front 6 in an opposite direction generates an occurrence of interference 12 of an opposite sign.

Thus, according to the invention, if the periodic interference 12aSp of the slave control circuit 1S is synchronized with the periodic interference 12aMp of the master control circuit 1M, the effects of these occurrences of interference are superposed. This results, as shown by the current curve 7Cb in FIG. 4 illustrating the occurrences of interference for two synchronized control circuits 1M, 1S, in the occurrences of interference 12aMp and 12aSp being superposed to form a single occurrence of interference 12bp. In addition, when advantageous, the signs of these occurrences of interference 12aMp, 12aSp are opposite, the effects thereof compensate for one another, and the residual interference 12bp is substantially less than the interference 12aMp, 12aSp observed in the absence of synchronization.

The occurrences of aperiodic interference 12aSq, 12aMq which are not synchronized remain present 12bMq, 12bSq in the signal 7Cb.

The aim of the invention is to synchronize the occurrences of periodic interference 12aMp caused by the master control circuit 1M with the occurrences of periodic interference 12aSp caused by the slave control circuit 1S.

From one control circuit 1 to the other, variations in the electrical characteristics of the components, thermal drift, variations in the applied voltage, or else variations in the current level, lead to a variation both in the delay 97 in the current 7 and in the delay 98 in the voltage 8. Therefore, synchronizing the edges 62 of the control signals 2M, 2S has little chance of synchronizing the occurrences of interference 12aMp, 12aSp. In order to succeed in synchronizing the occurrences of periodic interference 12aMp, 12aSp, the periodic edges 6 of the electrical quantity 7, 8 causing these occurrences of periodic interference 12aMp, 12aSp, namely the current 7 edges 67 or the voltage 8 edges 68, should be synchronized.

One method according to the invention thus proposes synchronizing at least one slave control circuit 1S, of switched type, controlled by a slave control signal 2S having pulse width modulation exhibiting a slave period 3S and controlling a slave load 4S, with a master control circuit 1M, of switched type, controlled by a master control signal 2M having pulse width modulation exhibiting a master period 3M and controlling a master load 4M.

Figure 6:
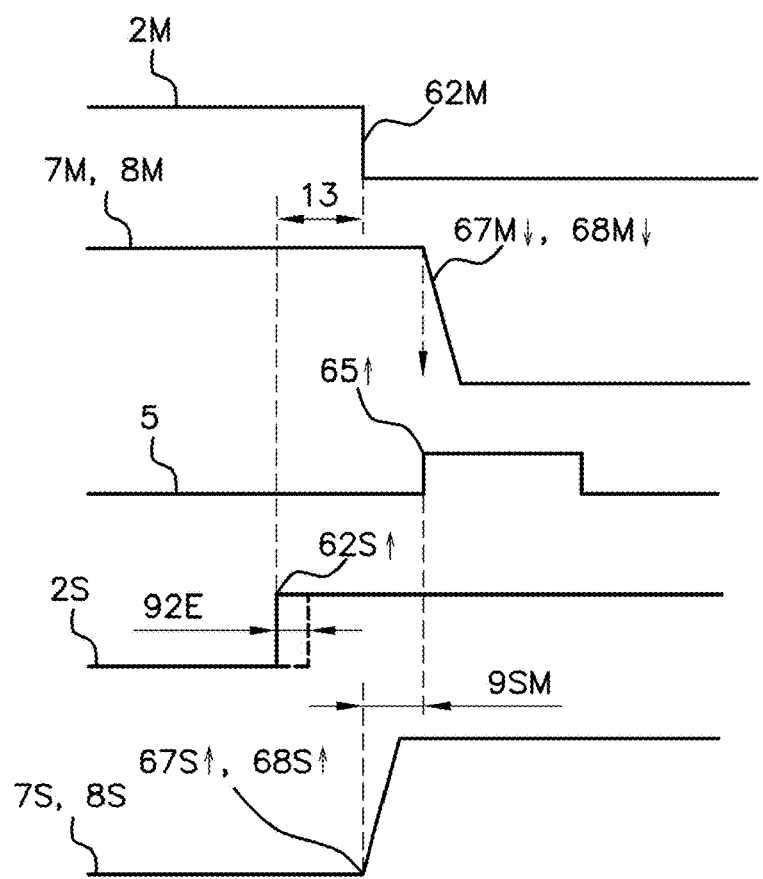

The description of such a method makes reference to FIGS. 6 and 7. FIG. 6 illustrates the state before synchronization and FIG. 7 illustrates the state after synchronization. Each of the figures, showing a diagram with time as abscissa, shows, from top to bottom, the master control signal 2M, the master electrical quantity 7M, 8M for the master load 4M resulting from the application of the preceding master control signal 2M to the master control circuit 1M, the synchronization signal 5, the slave control signal 2S, the same slave electrical quantity 7S, 8S for the slave load 4S resulting from the application of the preceding slave control signal 2S to the slave control circuit 1S.

The synchronization method comprises the following steps.

In a first step, the master control circuit 1M transmits a synchronization signal 5 that is indicative of a master edge 67M↓, 68M↓ of an electrical quantity 7M, 8M of the master load 4M. Thus, according to one embodiment, the synchronization signal 5 is, for example, a discrete signal. The time of detection of the start of the master edge 67M↓, 68M↓ is represented by a change of state of the synchronization signal 5, i.e. for example by an edge, for example a rising edge 65↑.

In a second step, the slave control circuit 1S receives the synchronization signal 5, and is thus informed of the start time of the master edge 67M↓, 68M↓.

In a third step, on the basis of this information indicated by the synchronization signal 5, and on the basis of knowledge, typically by way of a path inside the slave control circuit 1S, of the start time of a slave edge 67S↑, 68S↑ of the same electrical quantity 7S, 8S, a measurement of an interval 9SM is taken, typically by the slave control circuit 1S. The interval 9SM separates the slave edge 67S↑, 68S↑ of the electrical quantity 7S, 8S of the slave load 4S from the master edge 67M↓, 68M↓ of the same electrical quantity 7M, 8M of the master load 4M.

Next, in a fourth step, a timeshift 92E, 92T of the slave control signal 2S is applied, typically by the slave control circuit 1S, which timeshift tends to decrease said interval 9SM.

The third and fourth steps are next reprised and repeated until said interval 9SM is canceled out.

Such servo control is advantageous in that it continues to correct any potential difference between master and slave that could occur, regardless of the origin thereof.

Such servo control is also advantageous in that it allows the unknown delay 97M, 98M that exists between the master edge 62M↓ of the master control signal 2M and the master edge 67M↓, 68M↓ of the master electrical quantity 7M, 8M to be taken into account, along with the unknown delay 97S, 98S that exists between the slave edge 62S↑ of the slave control signal 2S and the slave edge 67S↑, 68S↑ of the slave electrical quantity 7S, 8S. Specifically, since the two delays 97M, 97S, or 98M, 98S, are unknown, the total shift 92T to be applied to the slave control signal 2S, in order to cancel out the interval 9SM, is correlated with the interval 9SM by the difference between the two delays 97M, 97S, or 98M, 98S.

According to one embodiment, an elementary shift 92E, which is small in comparison with the total shift 92T or in comparison with the interval 9SM, is applied to the slave control signal 2S. The repetition of the third step, measuring a new interval 9SM, and of the fourth step, applying an elementary shift 92E, the amplitude of which may be recalculated, guarantees convergence toward a total shift 92T such that the interval 9SM is zero.

According to another embodiment, a shift 92E that is substantially equal to the final value 92T is applied to the slave control signal 2S from the first iteration, in order to attempt to obtain convergence more quickly, substantially within one or two iterations.

According to another embodiment, a shift 92E that is equal to a value that is predetermined, pre-calculated and/or even received via a communication bus, approaching the final value 92T, is applied to the slave control signal 2S in order to attempt to obtain convergence more quickly.

According to another feature, the maximum shift 92T that can be applied to the slave control signal 2S is saturated by a maximum value.

The measurement of the interval 9SM may be positive or negative, for example following overcorrection. According to one embodiment of the servo control, only the sign of the interval 9SM is observed.

FIG. 7 illustrates the final state, in which the slave control signal 2S has been temporarily shifted by a total shift 92T, such that the interval 9SM is canceled out. Thus, the slave electrical quantity 7S, 8S has been shifted by an interval 9SM. The result is that the slave edge 67S↑, 68S↑ has been shifted by an interval 9SM and is now synchronized with the master edge 67M↓, 68M↓.

When carrying out servo control, the slave control signal 2S can only be delayed. Therefore, in order to facilitate synchronization and, in particular, to achieve it in a time window that is smaller than a period 3, it is advantageous to set a synchronization margin 13. For this purpose, optionally, at the latest before the measurement step marking the start of servo control, an initial delay of the master control signal 2M is advantageously applied. This delay is applied once and with a temporal amplitude 13 such that the slave control signal 2S leads the master control signal 2M. Thus, said synchronization time margin 13 makes it possible to subsequently delay the slave control signal 2S until obtaining synchronization.

Up until now it has not been specified which point in time of an edge 67, 68 is suitable for carrying out the synchronization. The figures suggest the use of the start of an edge 67, 68 as a reference, both for the detection of a master edge and for the timing of a slave edge. Such a value of 0% of an edge is one possibility among others. In order to be sure that it is indeed an edge, it may be advantageous to wait and to consider a value other than 0%, for example 10%, 20% or even 50%, both for the master edge and for the slave edge. In general, any value X % between 0% and 100% is possible. Such a value is taken to be identical for the master edge and for the slave edge.

For synchronization to be effective in decreasing the effects of a larger number of occurrences of interference 12, it is advantageous for the master period 3M to be equal to the slave period 3S. Such a feature makes it possible to synchronize one master edge out of two with one slave edge out of two.

Depending on the type of interference 12 that it is desired to decrease, namely either conducted interference or radiated interference, it is possible to choose to synchronize the slave current 7S slave edges 67S with the master current 7M master edges 67M or the slave voltage 8S slave edges 68S with the master voltage 8M master edges 68M.

Thus, the electrical quantity 7, 8 may be the current 7 flowing through the load 4. In this case, the synchronization compares/synchronizes a current master edge 67M with a current slave edge 67S.

Alternatively, the electrical quantity 7, 8 may be the voltage 8 across the terminals of the load 4. In this case, the synchronization compares a voltage master edge 68M with a voltage slave edge 68S.

It has been seen above, with reference to FIGS. 3, 4 and 5, that the sign of an occurrence of interference 12 depends on the direction of the edge 67, 68 of the electrical quantity 7, 8 causing the interference 12, which itself depends on the direction of the edge 62 of the original control signal 2M, 2S. It has also been seen that it is advantageous for the signs of an occurrence of slave interference 12 synchronized with an occurrence of master interference 12 to be opposite so that the synchronized occurrences of interference compensate for one another.

For this it is advantageous, as shown in FIG. 3, for the master control signal 2M and the slave control signal 2S to have, in relation to one another, edges of opposite direction. This may be obtained by configuring the master control signal 2M according to a first logic with a choice of a high level 11M, 11S at the start of a period 3M, 3S or a high level 11M, 11S at the end of a period 3M, 3S, and by configuring the one or more slave control signals 2S according to a second logic, different from the first logic.

Such a configuration does not intrinsically change a PWM control signal, which continues to transmit the same information. Such a configuration is most often supported by the logic/software means of a component that is capable of implementing a control circuit 1.

Thus, as shown in FIG. 3, the master control signal 2M is such that the high level 11M thereof is located at the end of the master period 3M, while the slave control signal 2S is such that the high level 11S thereof is located at the start of the slave period 3S. The result is thus that the master falling edge 62M↓, which is the periodic master edge, can thus be synchronized with the slave rising edge 62S↑, hence of the opposite direction, which is the periodic slave edge.

In order for the synchronization to be effective in decreasing a large number of occurrences of interference, the master edge 67M, 68M and the one or more slave edges 67S, 68S of the measurement step are advantageously chosen from among the periodic edges.

The periodic edge 6p, from between the two edges 6p, 6q of a period 3 of a control signal 2, is easily determined by means of knowledge of the high level logic 11. Thus, if the high level 11 is located at the end of the period 3, the periodic edge 6p is the falling edge 6↓, while the aperiodic edge 6q is the rising edge 6↑. Otherwise, if the high level 11 is located at the start of the period 3, the periodic edge 6p is the rising edge 6↑, while the aperiodic edge 6q is the falling edge 6↓. The high level logic 11, independently of the configuration characteristic described above, is known from the control circuit 1. By way of illustration, for the signal 2M of FIG. 3, the high level 11M of which is located at the end of the period 3M, the periodic edge 6p is the falling edge 62M↓ and the aperiodic edge 6q is the rising edge 62M↑. Otherwise, for the signal 2S of FIG. 3, the high level 11S of which is located at the start of the period 3S, the periodic edge 6p is the rising edge 62S↑ and the aperiodic edge 6q is the falling edge 62S↓.

For the reasons given above, in order for two synchronized occurrences of interference to compensate for one another, the direction of the master edge 67M, 68M and the direction of the one or more slave edges 67S, 68S used in the measurement step are advantageously chosen to be opposite.

The synchronization method is more particularly applicable to a master control circuit 1M applied to a master load 4M that is at least inductive. The master load 4M may also be resistive, but while preferably remaining primarily inductive.

The synchronization method is more particularly applicable to a slave control circuit 1S applied to a slave load 4S that is at least inductive. The slave load 4S may also be resistive, but while preferably remaining primarily inductive.

The invention also relates to an electronic component capable of implementing at least one master control circuit 1M and/or at least one slave control circuit 1S, said control circuits being capable of being synchronized by a method according to any one of the preceding embodiments.

To achieve this, it is necessary to supplement a component of the prior art by adding thereto, at the hardware level, a line for transmitting a synchronization signal 5 and/or a line for receiving a synchronization signal 5. A component capable of implementing a master control circuit 1M comprises a transmission line. A component capable of implementing a slave control circuit 1S comprises a receiving line. Advantageously, a component comprising a transmission line and a receiving line may be implemented in a master control circuit, or alternatively in a slave control circuit or both: a slave for a master control circuit and a master for another slave control circuit, in order to allow synchronizations in a cascade fashion. Such a component may also comprise a line that can be configured as a transmission line or as a receiving line so that the component may be implemented, according to preference, in a master control circuit or in a slave control circuit. Such a component also comprises the logic/software means suitable for implementing and executing the various functions/steps of the method.

For such a component, the line for transmitting and/or for receiving the synchronization signal 5, if it must be wired outside a housing comprising the component, requires at least one pin. In order to avoid this drawback, according to one advantageous embodiment, the electronic component comprises at least one master control circuit 1M and at least one slave control circuit 1S that are positioned within one and the same housing. Thus, the one or more transmission and/or receiving lines dedicated to the synchronization signals 5 and the connections thereof may be made within said housing and thus require no additional pin.

The invention claimed is:
1. A method for synchronizing at least one slave control circuit (1S), of switched type, controlled by a slave control signal (2S) having pulse width modulation exhibiting a slave period (3S) and controlling a slave load (4S), with a master control circuit (1M), of switched type, controlled by a master control signal (2M) having pulse width modulation exhibiting a master period (3M) and controlling a master load (4M), the method comprising the following steps:
 the master control circuit (1M) transmitting a synchronization signal (5) that is indicative of a master edge (67M, 68M) of an electrical quantity (7M, 8M) of the master circuit (1M);
 the slave control circuit (1S) receiving the synchronization signal (5);
 repeatedly measuring an interval (9SM) between a slave edge (67S, 68S) of the same electrical quantity (7S, 8S) of the slave circuit (1S) and the master edge (67M, 68M) of the electrical quantity (7M, 8M) of the master circuit (1M) as indicated by the synchronization signal (5), and time-shifting (92E, 92T) the slave control signal (2S) in a manner that decreases the measured interval (9SM), until said interval (9SM) is canceled out,
 wherein the direction of the master edge (67M, 68M) and the direction of the one or more slave edges (67S, 68S) of the measurement step are opposite.
2. The method as claimed in claim 1, further comprising:
 prior to the measurement step, initially delaying the master control signal (2M) so as to create a synchronization margin (13).
3. The method as claimed in claim 1, wherein the slave period (3S) is equal to the master period (3M).

4. The method as claimed in claim 1, wherein the electrical quantity (7, 8) is the current (7) flowing through the control circuit.

5. The method as claimed in claim 1, wherein the electrical quantity (7, 8) is the voltage (8) across the terminals of the load (4).

6. The method as claimed in claim 1, wherein the master edge (67M, 68M) and the one or more slave edges (67S, 68S) of the measurement step are chosen from among periodic edges.

7. The method as claimed in claim 1, further comprising:
configuring the master control signal (2M) according to a first logic, with a choice of a high level (11M) at the start of a period (3M) or a high level (11M) at the end of a period (3M); and
configuring the one or more slave control signals (2S) according to a second logic, different from the first logic.

8. The method as claimed in claim 1, wherein the master load (4M) is at least inductive.

9. The method as claimed in claim 1, wherein the one or more slave loads (4S) are at least inductive.

10. An electronic component for synchronizing at least one slave control circuit (1S), of switched type, controlled by a slave control signal (2S) having pulse width modulation exhibiting a slave period (3S) and controlling a slave load (4S), with a master control circuit (1M), of switched type, controlled by a master control signal (2M) having pulse width modulation exhibiting a master period (3M) and controlling a master load (4M), implementing the method as claimed in claim 1, comprising:
means for the master control circuit (1M) to transmit a synchronization signal (5) that is indicative of a master edge (67M, 68M) of an electrical quantity (7M, 8M) of the master circuit (1M);
means for the slave control circuit (1S) to receive the synchronization signal (5);
means for measuring an interval (9SM) between a slave edge (67S, 68S) of the same electrical quantity (7S, 8S) of the slave circuit (1S) and the master edge (67M, 68M) of the electrical quantity (7M, 8M) of the master circuit (1M) as indicated by the synchronization signal (5);
means for time-shifting (92E, 92T) the slave control signal (2S) so as to decrease said interval (9SM).

11. The electronic component as claimed in claim 10, further comprising:
at least one master control circuit (1M) and at least one slave control circuit (1S), positioned within one and the same housing.

12. The method as claimed in claim 2, wherein the slave period (3S) is equal to the master period (3M).

13. The method as claimed in claim 2, wherein the electrical quantity (7, 8) is the current (7) flowing through the control circuit.

14. The method as claimed in claim 3, wherein the electrical quantity (7, 8) is the current (7) flowing through the control circuit.

15. The method as claimed in claim 2, wherein the electrical quantity (7, 8) is the voltage (8) across the terminals of the load (4).

16. The method as claimed in claim 3, wherein the electrical quantity (7, 8) is the voltage (8) across the terminals of the load (4).

17. The method as claimed in claim 2, wherein the master edge (67M, 68M) and the one or more slave edges (67S, 68S) of the measurement step are chosen from among periodic edges.

18. The method as claimed in claim 3, wherein the master edge (67M, 68M) and the one or more slave edges (67S, 68S) of the measurement step are chosen from among periodic edges.

19. The method as claimed in claim 4, wherein the master edge (67M, 68M) and the one or more slave edges (67S, 68S) of the measurement step are chosen from among periodic edges.

* * * * *